United States Patent [19]

Radford et al.

[11] Patent Number: 4,560,462
[45] Date of Patent: Dec. 24, 1985

[54] APPARATUS FOR COATING NUCLEAR FUEL PELLETS WITH A BURNABLE ABSORBER

[75] Inventors: Kenneth C. Radford, Irwin; Herbert W. Keller, Monroeville, both of Pa.; Beryl H. Parks, Lexington; Robert R. Fuller, Columbia, both of S.C.

[73] Assignee: Westinghouse Electric Corp., Pittsburgh, Pa.

[21] Appl. No.: 623,747

[22] Filed: Jun. 22, 1984

[51] Int. Cl.⁴ ............................................. C23C 15/00
[52] U.S. Cl. ................................ 204/298; 204/192 R; 204/192 SP; 376/419
[58] Field of Search ........................................ 204/298

[56] References Cited

U.S. PATENT DOCUMENTS

| 3,427,222 | 2/1969 | Biancheria et al. | 176/68 |
| 3,562,140 | 2/1971 | Skinner et al. | 204/298 |
| 3,583,899 | 6/1971 | Aronson | 204/298 |
| 3,632,494 | 1/1972 | Herte et al. | 204/192 |
| 3,829,373 | 8/1974 | Kuehnle | 204/298 |
| 3,905,887 | 9/1975 | Kuehnle | 204/298 |
| 4,014,779 | 3/1977 | Kuehnle | 204/298 |
| 4,026,787 | 5/1977 | Kuehnle | 204/298 |
| 4,046,666 | 9/1977 | McClanahan et al. | 204/298 |
| 4,080,281 | 3/1978 | Endo | 204/298 |
| 4,137,142 | 1/1979 | Vertegaal | 204/298 |
| 4,151,064 | 4/1979 | Kuehnle | 204/298 |
| 4,197,814 | 4/1980 | Takagi et al. | 118/726 |
| 4,198,283 | 4/1980 | Class et al. | 204/298 |
| 4,204,936 | 5/1980 | Hartsough | 204/192 R |
| 4,252,626 | 2/1981 | Wright | 204/298 |
| 4,268,374 | 5/1981 | Lepselter | 204/298 |
| 4,275,126 | 6/1981 | Bergmann et al. | 429/30 |
| 4,304,983 | 12/1983 | Pierfederici | 204/298 |
| 4,308,126 | 12/1981 | Wright | 204/298 |
| 4,325,776 | 4/1982 | Menzel | 156/610 |
| 4,331,526 | 5/1982 | Kuehnle | 204/192 R |
| 4,380,211 | 4/1983 | Shinohara | 118/718 |

OTHER PUBLICATIONS

Ronald S. Nowicki, "Origins and Minimization of Defects in Sputtered Thin Films", *Solid State Technology*, Dec. 1980, pp. 83–88.
A. R. Nyaiesh et al., "The Dependence of Deposition Rate on Power Input for dc and rf Magnetron Sputtering," Vacuum, vol. 31/No. 7, (1981), pp. 315–317.
S. Schiller et al., "Methods and Applications of Plasmatron High-Rate Sputtering in Microelectronics, Hybrid Microelectronics and Electronics," published by Vac-Tec Systems Ltd., 1981, pp. 381-1 to 381-23.

*Primary Examiner*—Arthur P. Demers
*Attorney, Agent, or Firm*—D. E. Erickson

[57] ABSTRACT

Apparatus for depositing a coating (such as a burnable absorber) on nuclear fuel pellets. Pallets 16 hold a single layer of fuel pellets 22 between lower and upper screened parts 18 and 20. A rotating drum 14 holds the pallets 16 on its circumference. A chamber 12 encloses the drum 14. A sputtering machine 24 has stationary, sputter-frangible) upper and lower targets (such as zirconium diboride) 26 and 28. The stationary upper targets 26 are placed inside the drum's circumference above its longitudinal axis and are pointed facing generally upward and radially outward. The stationary lower targets 28 are placed outside the drum's circumference below its longitudinal axis and are pointed facing generally upward and radially inward. The target material is sputtered onto the fuel pellets 22 as the pallets 16 on the drum 14 rotate past.

17 Claims, 9 Drawing Figures

APPARATUS FOR COATING NUCLEAR FUEL PELLETS WITH A BURNABLE ABSORBER

BACKGROUND OF THE INVENTION

The present invention relates generally to apparatus for depositing coatings on substrates and, more particularly, to apparatus for sputter coating nuclear fuel pellets.

Nuclear pellets have the shape of generally right circular cylinders. The fuel pellets contain fissionable material, such as uranium dioxide, thorium dioxide, plutonium dioxide, or mixtures thereof. The pellets are placed in end-to-end abutment within a cladding tube (typically made of a zirconium alloy or stainless steel) to make a fuel rod. The fuel rods usually are grouped together to form a fuel assembly. The fuel assemblies are arranged together to constitute the core of a nuclear reactor.

As is known to those skilled in the art, the life of a fuel assembly may be extended by combining an initially larger amount of fissionable material as well as a calculated amount of burnable absorber. Burnable absorbers are materials (such as boron, gadolinium, samarium, europium, and the like) which have a high probability (or cross section) for absorbing neutrons, resulting in isotopes of sufficiently low neutron capture cross section so as to be substantially transparent to neutrons, all while producing no new or additional neutrons. The burnable absorber compensates for the larger amount of fissionable material during the early life of the fuel assembly. During reactor operation, the burnable absorbers are progressively reduced in amount, resulting in a longer life at relatively constant fission level for the fuel assembly. Longer fuel assembly life means less frequent nuclear reactor fuel assembly replacement. This refueling process is costly and time consuming.

U.S. Pat. No. 3,427,222 discloses fusion bonding a burnable poison (also known as a burnable absorber) layer to the surface of a nuclear fuel pellet substrate. Commonly assigned U.S. patent application Ser. No. 526,712 ("Coating a Nuclear Fuel with a Burnable Poison" by Kenneth C. Radford, filed Aug. 26, 1983) discloses sputtering as a method for depositing a layer of burnable poison on nuclear fuel pellets. The present invention discloses apparatus for accomplishing the sputtering operation in a unique manner.

Sputtering is a process for depositing a coating on a substrate, as is known to those skilled in the art. An inert gas is introduced into a vacuum chamber containing an anode, the substrate, and a target cathode. A high voltage is applied across the anode and target cathode. The gas molecules are ionized and strike the target cathode. This causes atoms and/or molecules of the target cathode to be sputtered from the target cathode's surface. The substrate is positioned to intercept this sputtered target material which forms an adherent coating upon striking the substrate. Sputtering is a generally line-of-sight coating process.

A sputtering apparatus is disclosed in U.S. Pat. No. 4,080,281 for making metal films, such as electrical resistors or electrodes of electrical capacitors. The substrates are placed in an annular cylindrical cage which serves as the anode. The outer coaxial, annular cylindrical target cathode circumferentially surrounds the cage to sputter radially inward on the cage from all directions, including downward. The inner coaxial, rod target cathode lies along the cage's longitudinal axis to sputter radially outward on the cage from all directions, including downward. The cage rotates to cause the metal films to be more uniform.

U.S. Pat. Nos. 3,562,140 and 3,632,494 disclose sputtering apparatus for coating razor blades with chromium. The razor blades are on a rotating drum. The razor blades are caused to rotate with respect to the drum as the drum rotates, to allow both edges of double-edge blades to be coated from a single target cathode.

SUMMARY OF THE INVENTION

Briefly stated, the invention is directed towards apparatus for depositing a coating on nuclear fuel pellets. The coating apparatus includes a rotatable drum and an enclosed pallet placed in an open area on the drum's circumference and attached to the drum. The pallet has lower and upper screened parts containing therebetween a single layer of nuclear fuel pellets. The coating apparatus also includes a chamber, into which the drum is placed, and a device to rotate the drum. Additionally, the coating apparatus has a sputtering machine and has a controller to control it and the drum rotating device. The sputtering machine includes a stationary, sputter-frangible, upper target placed inside the drum's circumference above its longitudinal axis and pointed generally up and radially out to sputter the coating onto exposed pellet areas as the drum rotates the pallet past the upper target. The sputtering machine also includes a stationary, sputter-frangible, lower target placed outside the drum's circumference below its longitudinal axis and pointed generally up and radially in to sputter the coating onto exposed pellet areas as the drum rotates the pallet past the lower target.

BRIEF DESCRIPTION OF THE DRAWINGS

The subject matter of the invention is particularly pointed out and distinctly claimed in the concluding portion of this specification. The invention, however, both as to organization and method operation, together with further advantages thereof, may best be understood by reference to the following description taken in connection with the accompanying drawings, in which:

DETAILED DESCRIPTION OF THE INVENTION

Figure 1:
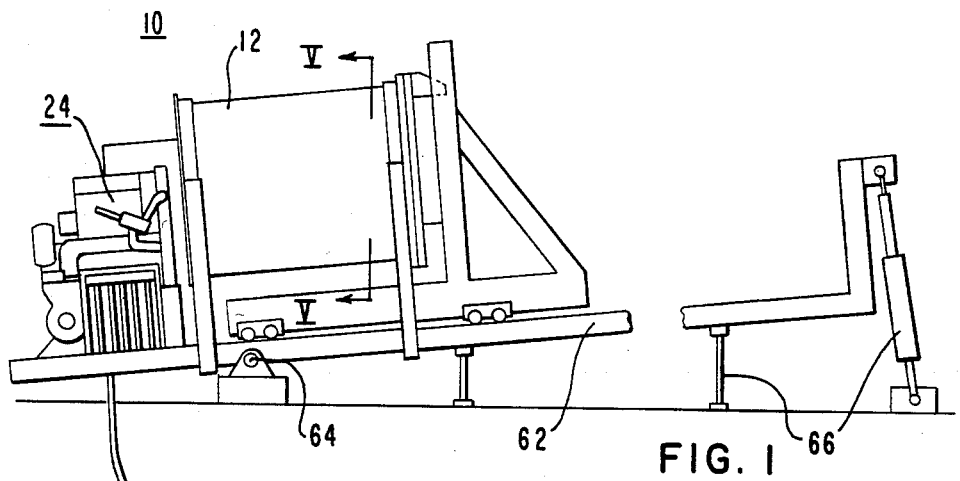
FIG. 1 is a schematic view of a preferred embodiment of the coating apparatus of the present invention.
Figure 2:
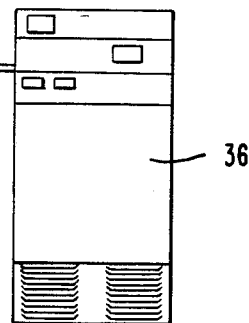
FIG. 2 is a schematic view showing the drum removed from the chamber of the coating apparatus shown in FIG. 1.
Figure 2:
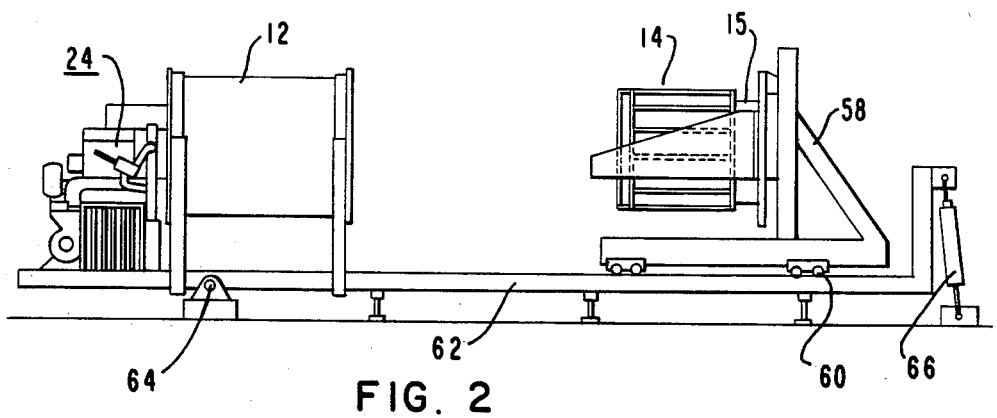
Figure 3:
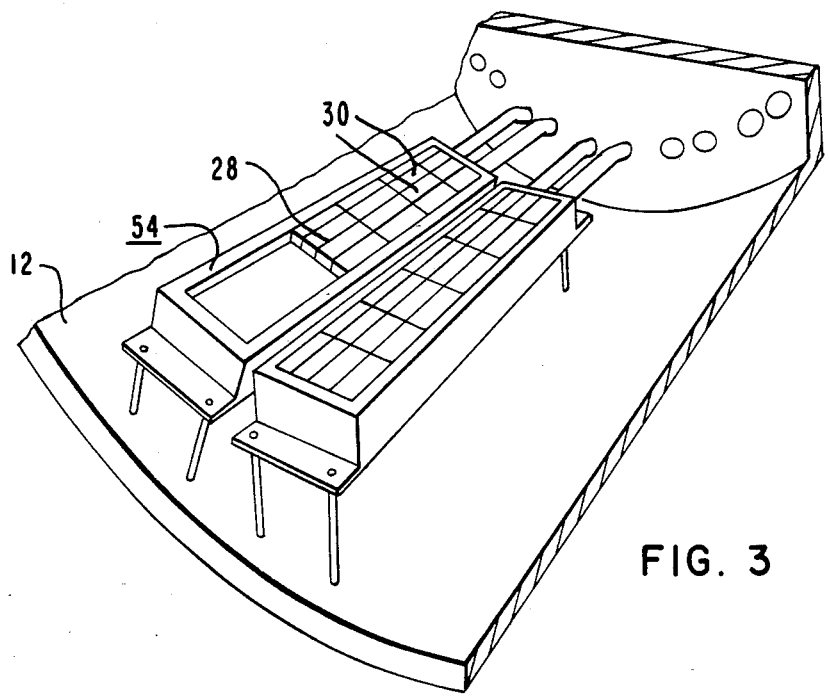
FIG. 3 is a front perspective view of a lower portion of the open chamber of FIG. 2 looking inside, showing stationary lower targets including target tiles.
Figure 4:
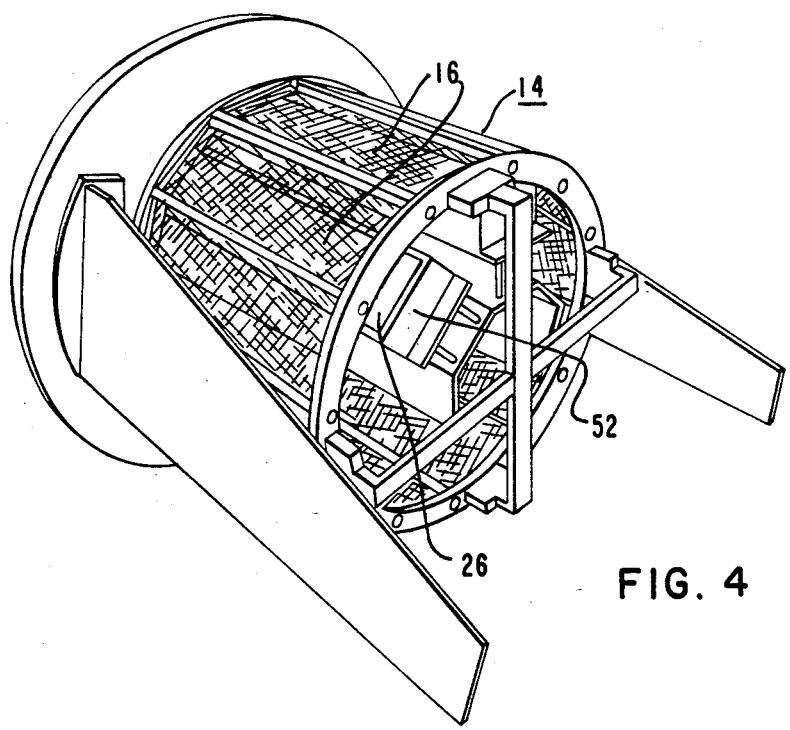
FIG. 4 is a back perspective view of the drum of FIG. 2 also depicting stationary upper targets.
Figure 5:
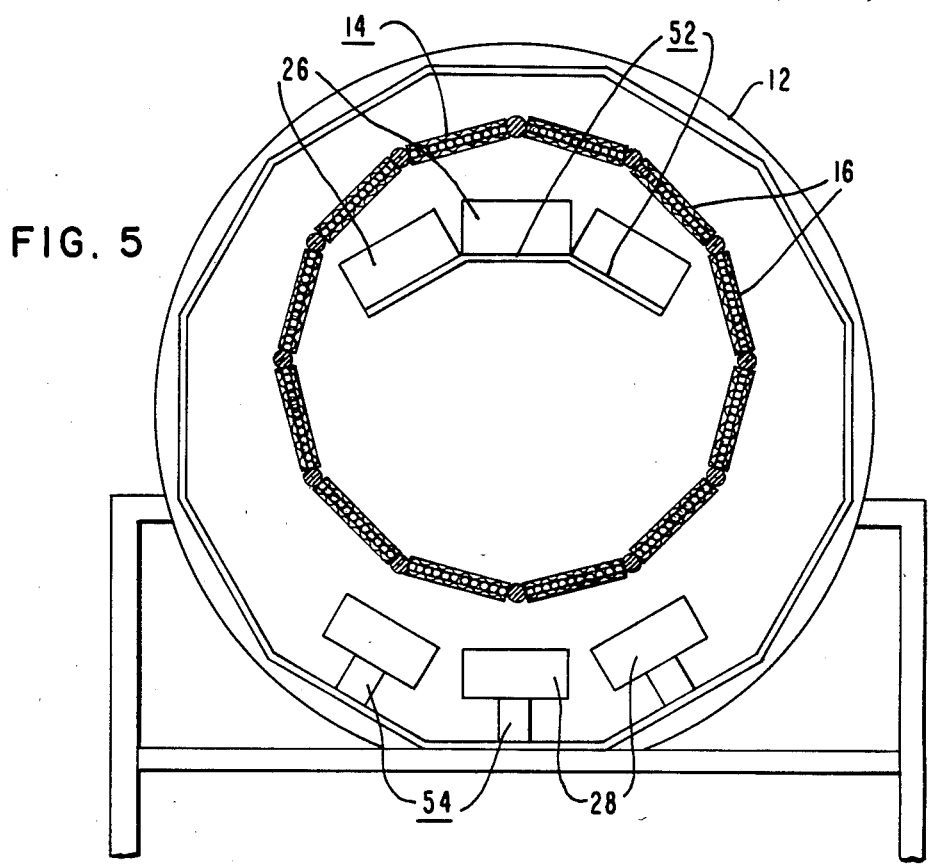
FIG. 5 is a schematic sectional view along lines V—V of FIG. 1 showing the pellet-containing pallets on the drum and the accompanying stationary lower and upper targets.
Figure 6:
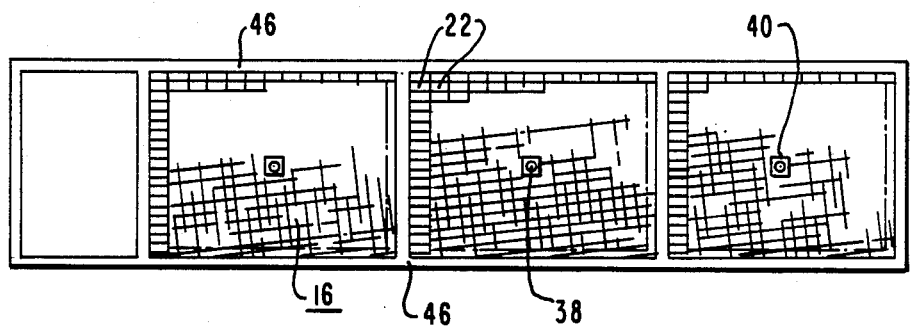
FIG. 6 is a planar view, with portions broken away, of an enclosed pallet of FIG. 5 detached from the drum.
Figure 7:
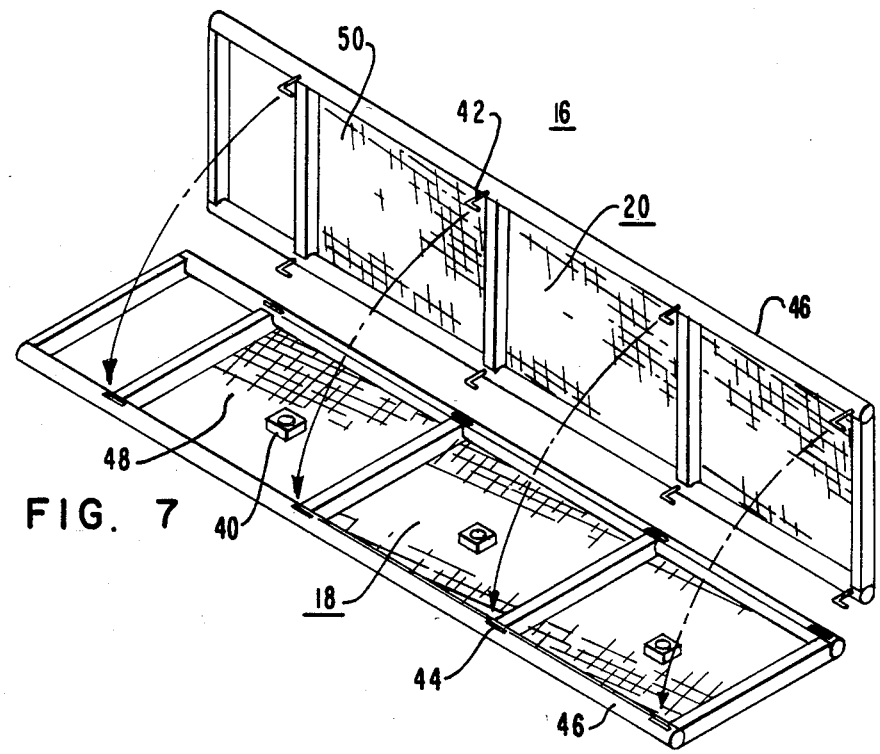
FIG. 7 is a perspective view of the pallet of FIG. 6 with the upper screened part detached from the lower screened part.
Figure 8:
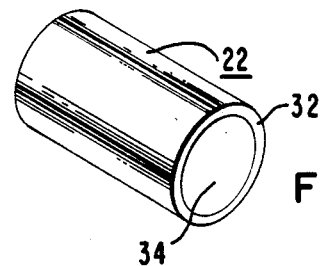
FIG. 8 is a perspective view of a coated nuclear fuel pellet removed from a pallet of FIG. 5.
Figure 9:
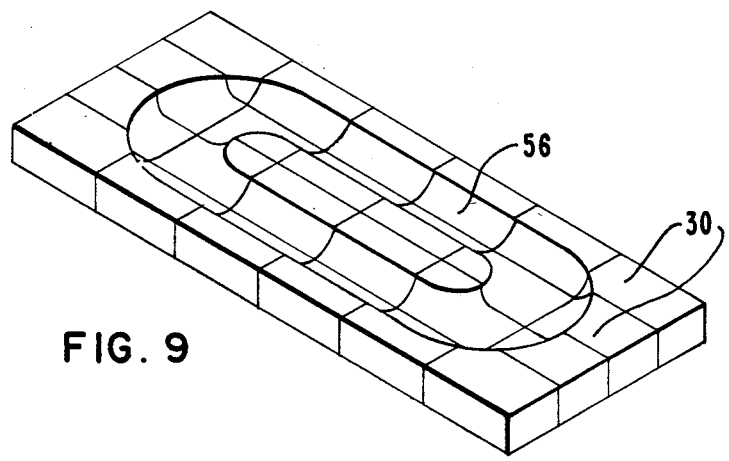
FIG. 9 is an enlarged perspective view of the target tiles removed from either a stationary lower target shown in FIG. 3 or a stationary upper target shown in FIG. 4.

A preferred embodiment of the nuclear fuel pellet coating deposition apparatus 10 of the present invention is shown in FIG. 1. The coating apparatus 10 includes a chamber 12 (FIGS. 1, 2 and 3) and a generally cylindrical, skeletonized drum 14 (FIGS. 2, 4 and 5) which is rotatable about its longitudinal axis by a motor 15 (FIG. 2). The drum 14 is hermetically sealable within the chamber 12 (FIG. 1 with drum installed; FIG. 2 with drum removed) with the longitudinal axis of the drum 14 oriented generally horizontally. The drum's circumference has a number of detachable enclosed pallets 16 with lower and upper screened parts 18, 20 (FIGS. 4, 5, 6 and 7). Each pallet 16 can contain only a single layer of nuclear fuel pellets 22 (FIGS. 6 and 8). The coating apparatus 10 also contains a sputtering machine 24 (FIGS. 1 and 2) having stationary upper targets 26 (FIGS. 4 and 5) and stationary lower targets 28 (FIGS. 3 and 5). The targets 26 and 28 each include a number of target tiles 30 (FIGS. 3 and 9) which are sputtered as a coating 32 onto the substrate 34 of the nuclear fuel pellet 22 (FIGS. 6 and 8). A control console 36 (FIG. 1) is used to control the drum motor 15 and the sputtering machine 24.

Typically, the fuel pellets 22 are generally right circular cylindrical pellet substrates 24 of uranium dioxide having a length of approximately 0.530 inch and a diameter of approximately 0.3225 inch which are covered with a coating 32 of a burnable absorber, such as a 4/10 mil thick layer of zirconium diboride. Other pellet substrate and coating dimensions may be chosen by the designer, as is known to those skilled in the art. Depending upon the burnable absorber requirements of a particular fuel load, only the circumferential surface of the substrate 24 of the pellet 22, only the middle pellets in a fuel rod, only some of the fuel rods in a fuel assembly, and only some of the fuel assemblies in a reactor core would receive a pellet coating 32. Applicants found that a zirconium diboride target was a sputter-frangible target, meaning it would break up during the sputtering process. A target is relatively expensive, and a sputter-frangible target sputtering downward would quickly break up and fall away, contaminating the subsrates. By sputtering upward, these broken target pieces would continue to participate in the sputtering process. Also, Applicants have found that target breakup is reduced by using a number of smaller target tiles for the target instead of a single large target tile.

In the sputtering apparatus 10, the pallets 16 each are of a generally rectangular configuration capable of holding only a single layer of fuel pellets 22. This is accomplished by suitable spacing between the lower and upper screened parts 18 and 20. If such spacing allowed multiple fuel pellet layers in the pallet, there would be problems, during sputtering, such as pellet chipping or breakage, dusty pellet coatings from pellet attrition, and lack of uniformity in pellet coatings. The upper screened part 20 is detachable from the lower screened part 18 via bolts 38 through the upper screened part 20 threaded to nuts 40 secured to the lower screen part 18 and via hooks 42 engageable in grooves 44 in the screened parts 18 and 20 so that the fuel pellets 22 may be easily loaded and unloaded. The pallet 16 (including its screened parts 18 and 20) is made of stainless steel, as Applicants have found that to be a material to which sputtered zirconium diboride will not adhere. Preferably, the fuel pellets 22 in the pallet 16 are aligned end-to-end into columns and align side-by-side into rows (except in the area taken up by the nuts 40). A typical pallet 16 may have 38 rows and 19 columns of fuel pellets 22.

The skeletonized drum 14 has a number (at least one) of spaced-apart open areas in its circumference such that each pallet 16 is disposable in a corresponding circumferential open area and there removably attached to the drum 14 such that the lower and upper screened parts 18 and 20 face along a radial direction. Typically, the drum 14 will hold twelve such pallets 16 on the circumference of the drum 14 in an array having the cross-sectional shape of a generally equilateral dodecagon. Preferably, the pallets 16 are attached to the drum 14 such that the fuel pellets 22 have each of their pellet columns generally coplanar with and parallel to the drum's longitudinal axis.

Applicant's early experiments produced striped fuel pellets, which were coated fuel pellets having uncoated areas where the screened parts 18 and 20 had shielded the fuel pellets from the sputtering target material. Although these striped pellets were determined to be satisfactory from a nuclear standpoint, a more uniform coating of an unstriped fuel pellet 22 was desired. Also, it was sought to insure that the ends of the fuel pellet 22 would not be coated. For example, a boron containing burnable absorber on the ends of the fuel pellets would be undesirable from both a nuclear and a chemical standpoint. To achieve these goals, the lower and upper screened parts 18 and 20 were spaced apart at a distance allowing the single layer of fuel pellets 22 a slidable and rollable fit within the pallet 16. During the sputtering process, the chamber 12 (with the enclosed drum 14) is tilted with respect to the horizontal at an angle not exceeding ten degrees, and preferably at an angle of approximately five degrees. Such a small angle is considered to be included in defining the drum's longitudinal axis to be oriented generally horizontally. This small angle allowed pellet circumferences to be coated while preventing the coating deposition on the pellet ends by eliminating any spaces between the ends of the aligned pellets. The side-to-side rolling of the fuel pellets 22 eliminated longitudinal uncoated striped areas. The rolling was controlled by the spacing of the parallel side 46 of the pallet 16. These sides 46 sideways retain each pellet row such that if the row were biased against one of the pallet sides 46, there would be a gap between that row and the other of the pallet sides 46 of between approximately 1/16 and 1/32 of an inch. Preferably, the gap is approximately 3/64 inch for an approximately 0.3225 inch diameter fuel pellet 22. The transverse uncoated stripped areas of the fuel pellets 22 are removed by having the screen grid patterns 48 and 50 of the lower and upper screened parts 18 and 20 of the pallet 16 be rotated such that a pellet column projected onto each screen grid pattern defines angles, with respect thereto, of between approximately 5 degrees and approximately 40 degrees. Preferably, these projected angles are each generally 15 degrees. With this arrangement, a rolling fuel pellet does not come back to its exact same position under the grid so every circumferential part of the pellet substrate 34 is coated. Rolling pellets in a rotated screen grid eliminated the uncoated striped areas on the fuel pellets 22.

The sputtering machine 24 sputters the coating 32 onto the pellets substrate 34. The technology for the anodes, the cathodes, and the support equipment for sputtering is known to those skilled in the art and is available commercially. In the present invention, the drum 14 (including the pallets 16) is made an anode for the sputtering machine 24.

The sputtering machine 24 has upper cathodes 52 supporting the stationary, sputter-frangible, upper targets 26 such that, when the drum 14 is placed in the chamber 12, the upper targets 26 are disposed inside and proximate the drum's circumference at a location which is above the drum's longitudinal axis. Of course, the upper targets 26 are longitudinally positioned to correspond with the longitudinal position of the drum's open areas. The stationary upper targets 26 are oriented to face generally upward and radially outward. As the sputterfrangible upper targets 26 break up during sputtering, they therefore will be held in their container cathodes 52 to be continued to be consumed in the sputtering process. A downward target orientation would cause the fragmented target pieces to fall uselessly away or even to contaminate the surface of any substrate (awaiting coating by the sputtered target atoms/molecules) which may be located below. It is important to distinguish between the micro pieces (i.e., atoms/molecules) of the upper targets 26 (or target tiles 30) which are sputtered, and the macro pieces which are fragmented during the sputtering process by certain sputter frangible material, such as zirconium diboride. The upper targets 26 sputter the coating 32 onto those areas of the fuel pellets 22 (pellet substrate 34), in the pallet 16 on the rotating drum 14, which are exposed to the stationary upper targets 26 each time the pallets 16 rotate past.

The sputtering machine 24 also has lower cathodes 54 supporting the stationary, sputter-frangible, lower targets 28 such that, when the drum 14 is placed in the chamber 12, the lower targets 28 are disposed outside and proximate the drum's circumference at a location which is below the drum's longitudinal axis. The lower targets 28 likewise are longitudinally positioned to correspond with the longitudinal position of the drum's open areas. The stationary lower targets 28 are oriented to face generally upward and radially inward. Concerning target fragmentation, the upward facing lower targets 28 behave like the upward facing upper targets 26 discussed in the previous paragraph. The lower targets 28 sputter the coating 32 onto those areas of the fuel pellets 22 (pellet substrates 34), in the pallet 16 on the rotating drum 14, which are exposed to the stationary lower targets 28 each time the pallet 16 rotates by.

Preferably, the stationary upper and lower targets 26 and 28 each are made up of a number of generally identical target tiles 30, with each target tile 30 being interchangeable in position with the other target tiles 30 in its target 26 and 28. During sputtering, the target is consumed predominately along a race-track-shaped groove 56 due to the dynamics of the process. Since the target 26 and 28 is expensive, longer target life is achieved by having the target 26 and 28 be in the form of target tiles 30 which can be interchanged in position to expose ungrooved areas during subsequent sputtering runs.

Although sputtering could be accomplished with a single upper and lower target pair 26 and 28, it is preferred to have a total of three such pairs for sputtering of sputter-frangible material such as the burnable poison zirconium diboride. With such a number of circumferentially spaced-apart stationary upper targets 26 and such like number of circumferentially spaced-apart stationary lower targets 28, a higher coating rate is achieved. Also, the controller 36 can sequentially activate different cathode pairs for chosen time periods (where each pair is of the same target material but different pairs are of different materials) to produce duplex or triplex coatings. If a coating, such as a zirconium hydrophobic overcoat, were not associated with a sputter-frangible target, that target could face generally downward and such additional targets could be added to the coating apparatus 10, as can be appreciated by those skilled in the art.

The sputtering process, for high coating deposition rates, heats up the pellet substrates 34. A desired cooling effect, which helps maintain desired coating temperatures, is achieved by controlling the revolution rate of the drum 14 combined with the only partial circumferential placement of the upper and lower targets 26 and 28. Thus a particular area on the pellet substrate 34 (even if it did not roll) will not be constantly exposed to sputtering as the drum 14 rotates. Also, if the targets were in only one location, instead of being located in upper and lower positions, the pellet coating may be fractured by thermal shock during the sputtering process. Typical dimensions and operating parameters (not intending to be limiting but merely serving as examples) include a uranium dioxide fuel pellet substrate of 0.3225" in diameter, 0.530" in length, and 7.8 g. in weight. The pellet array in the pallet has 38 rows and 19 columns. The sideways gap allowing the pellets to roll is between 46 and 150 thousanths of an inch. The screen grids (screen grid patterns) each have a rotation angle of 15° for their 28 thousandths of an inch diameter stainless steel wires, with parallel wires spaced $\frac{1}{4}$" apart. The chamber is tilted 5° from the horizontal. The drum rotates 1 revolution in 30 seconds. The zirconium diboride sputtering rate per cathode pair is 4/10 of a mil (final coating thickness) in 28 to 30 hours. Each target is a 27×5 inch rectangle made up of 4 columns and 6 rows of zirconium diboride target tiles (each a rectangle of $4\frac{1}{2} \times 1\frac{1}{4}$ inch) $\frac{3}{8}$ inch thick.

In operation, the target tiles 30 of the targets 26 and 28 are placed in the cathodes 52 and 54. The pellet substrates 34 are loaded into the pallets 16 which then are secured to the drum 14. The drum 14, which is attached to a support 58, next is moved by support rollers 60 over a frame 62 (which also holds the chamber 12) and is installed in the chamber 12 to form a hermetically sealed unit. The frame 62 then is tilted about a hinge 64 by pistons 66 to an angle of about five degrees from the horizontal. At this point, the control console 36 (operated in manual or automatic mode) controls the sputtering machine 24 and the drum motor 15, as is known to those skilled in the art, to sputter the coating 32 on the pellet substrate 34. After a predetermined time (which may be chosen by experimental sputtering runs), the control console (operated in manual or automatic mode) ceases the sputtering operation and returns the system to a state allowing for removal of the fuel pellets 22. At this time, the installation steps described above are reversed, leading to the removal of the fuel pellets 22 for their subsequent use in fuel rods of nuclear reactors.

It will be apparent that many modifications and variations are possible in light of the above teachings. It, therefore, is to be understood that within the scope of the appended claims, the invention may be practiced other than as specifically described.

We claim:

1. Apparatus for depositing a coating on nuclear fuel pellets, comprising:
    (a) a generally cylindrical drum rotatable about its longitudinal axis, the circumferential part of said drum having a portion with an open area;
    (b) an enclosed pallet having a lower screened part and a detachable upper screened part with said lower and upper screened parts spaced apart at a distance allowing said pellets to be disposed only in a single layer within said pallet between said lower and upper screened parts, said pallet disposable generally in said open area of said drum and, there disposed, removably attachable to said drum with said upper and lower screened parts facing along a general radial direction;
    (c) a chamber, said drum disposable within said chamber with the longitudinal axis of said drum oriented generally horizontally, said chamber with the disposed said drum defining a hermetically sealed unit;
    (d) means for rotating said drum about its longitudinal axis;
    (e) means for sputtering said coating on said pellets, said sputtering means, when said drum is disposed within said chamber, having a stationary, sputter-frangible, upper target disposed inside and proximate the circumferential part of said drum at a location which is above the longitudinal axis of said drum and which is at a longitudinal distance corresponding to that of said open area of said drum, said stationary upper target oriented to face generally upward and radially outward to sputter said coating onto those areas of said pellets, in said pallet on the rotating said drum, which are exposed to said stationary upper target as said pallet rotates past, said sputtering means, when said drum is disposed within said chamber, also having a stationary sputter-frangible, lower target disposed outside and proximate the circumferential part of said drum at a location which is below the longitudinal axis of said drum and which is at a longitudinal distance corresponding to that of said open area of said drum, said stationary lower target oriented to face generally upward and radially inward to sputter said coating onto those areas of said pellets, in said pallet on the rotating said drum, which are exposed to said stationary lower target as said pallet rotates past; and
    (f) means for controlling said drum rotating means and said sputtering means.

2. The apparatus of claim 1, wherein said coating includes a burnable absorber.

3. The apparatus of claim 2, wherein said pellets comprise uranium dioxide and said burnable absorber consists essentially of zirconium diboride.

4. The apparatus of claim 3, wherein said pallet, including said upper and lower screened parts, consists essentially of stainless steel.

5. The apparatus of claim 1, wherein said pellets are disposed within said pallet such that said pellets are aligned generally end-to-end into columns and aligned generally side-by-side into rows, and wherein said pallet is attached to said drum such that each of said columns is generally coplanar with and parallel to the longitudinal axis of said drum and with said lower and upper screened parts spaced apart at a distance allowing said pellets a slidable and rollable fit within said pallet.

6. The apparatus of claim 5, wherein said chamber, with said drum disposed therein, is tilted with respect to the horizontal at an angle not exceeding 10 degrees during the sputtering of said coating.

7. The apparatus of claim 6, wherein said angle is approximately 5 degrees.

8. The apparatus of claim 5, wherein said pallet includes generally parallel sides sideways retaining each of said rows of said pellets in said pallet such that if a said pellet row were biased against one of said pallet sides, there would be a gap between said pellet row and the other of said pallet sides of between approximately 1/16 and 1/32 of an inch.

9. The apparatus of claim 8, wherein said single said pellet has a diameter of approximately 0.3225 inch, and said gap is approximately 3/64 inch.

10. The apparatus of claim 8, wherein said lower and upper screened parts each have a screen grid pattern with each said screen grid pattern rotated such that a said column of said pellets projected onto each said screen grid pattern defines an angle with respect thereto of between approximately 5 degrees and approximately 40 degrees.

11. The apparatus of claim 10, wherein each of said angles is approximately 15 degrees.

12. The apparatus of claim 1, wherein said drum also includes a number of additional and circumferentially spaced-apart open areas generally identical with, and circumferentially spaced apart from, said open area; and also including a like number of additional pallets corresponding to said additional open areas, said additional pallets generally identical with said pallet.

13. The apparatus of claim 12, wherein said pallet plus said additional pallets total 12 in number.

14. The apparatus of claim 1, wherein said sputtering means also includes a number of additional and circumferentially spaced-apart stationary, sputter-frangible, upper targets generally identical with, and circumferentially spaced apart from, said stationary upper target; and wherein said sputtering means also includes a like number of additional and circumferentially spaced-apart stationary, sputter-frangible, lower targets generally identical with, and circumferentially spaced apart from, said stationary lower target.

15. The apparatus of claim 14, wherein said stationary upper target plus said additional stationary upper targets total 3 in number.

16. The apparatus of claim 1, also for depositing an additional different coating on said pellets on top of said coating, wherein:
    (a) said sputtering means also includes an additional stationary upper target generally identical with, and circumferentially spaced apart from, said stationary upper target;
    (b) said sputtering means also includes an additional stationary lower target generally identical with, and circumferentially spaced apart from, said stationary lower target;
    (c) said stationary upper target and said stationary lower target each consist essentially of a material corresponding to said coating;
    (d) said additional stationary upper target and said additional stationary lower target each consist essentially of a material corresponding to said additional different coating; and (e) said controller means controls said sputtering means to first activate for a predetermined time said stationary upper and lower targets to sputter said coating, and then to activate for a preselected time said additional stationary upper and lower targets to sputter said additional different coating.

17. The apparatus of claim 1, wherein said stationary upper and lower targets each comprise a plurality of generally identical target tiles, each of said target tiles being interchangeable in position with any of the other of said target tiles in its said target.

* * * * *